(12) United States Patent
Matsumura et al.

(10) Patent No.: US 10,777,287 B2
(45) Date of Patent: Sep. 15, 2020

(54) MEMORY CONTROL APPARATUS, INFORMATION PROCESSING APPARATUS, AND MEMORY CONTROL METHOD

(71) Applicant: FUJITSU LIMITED, Kawasaki-shi, Kanagawa (JP)

(72) Inventors: Masayoshi Matsumura, Kawasaki (JP); Hiroshi Nakayama, Yokohama (JP); Takao Matsui, Kawasaki (JP); Takashi Yamamoto, Kawasaki (JP); Yuka Hosokawa, Ota (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/438,727

(22) Filed: Jun. 12, 2019

(65) Prior Publication Data

US 2019/0385686 A1    Dec. 19, 2019

(30) Foreign Application Priority Data

Jun. 14, 2018    (JP) .................................. 2018-113253

(51) Int. Cl.
*G11C 16/04*    (2006.01)
*G11C 16/34*    (2006.01)
*G11C 7/10*    (2006.01)
*G11C 16/26*    (2006.01)
*G11C 16/14*    (2006.01)

(52) U.S. Cl.
CPC .......... *G11C 16/3445* (2013.01); *G11C 7/109* (2013.01); *G11C 7/1063* (2013.01); *G11C 16/14* (2013.01); *G11C 16/26* (2013.01); *G11C 16/3459* (2013.01)

(58) Field of Classification Search
CPC ....... G11C 6/3445; G11C 7/063; G11C 7/109; G11C 16/14
USPC ...................................................... 365/185.29
See application file for complete search history.

(56) References Cited

U.S. PATENT DOCUMENTS 6,304,486 B1    10/2001    Yano
9,152,551 B2 *  10/2015    Mun ................... G11C 16/0483
9,927,990 B2 *   3/2018    Torii ..................... G06F 3/0619
10,402,109 B2 *  9/2019    Yu ........................... G06F 3/064

FOREIGN PATENT DOCUMENTS

JP    11-260075    9/1999
JP    2001-176276   6/2001
JP    2004-134085   4/2004

* cited by examiner

*Primary Examiner* — Vu A Le
(74) *Attorney, Agent, or Firm* — Fujitsu Patent Center

(57) ABSTRACT

A memory control apparatus includes a randomizer configured to: randomize write data output from an arithmetic processing apparatus, and output the randomized write data to a memory; a derandomizer configured to: derandomize data read from the memory, and generate derandomized read data when a flag included in the data read from the memory indicates the randomized write data; and a selector configured to: select the derandomized read data and output the selected derandomized read data to the arithmetic processing apparatus when the flag indicates the randomized write data, and select the data read from the memory and output the selected read data to the arithmetic processing apparatus when the flag indicates deleted data.

13 Claims, 15 Drawing Sheets

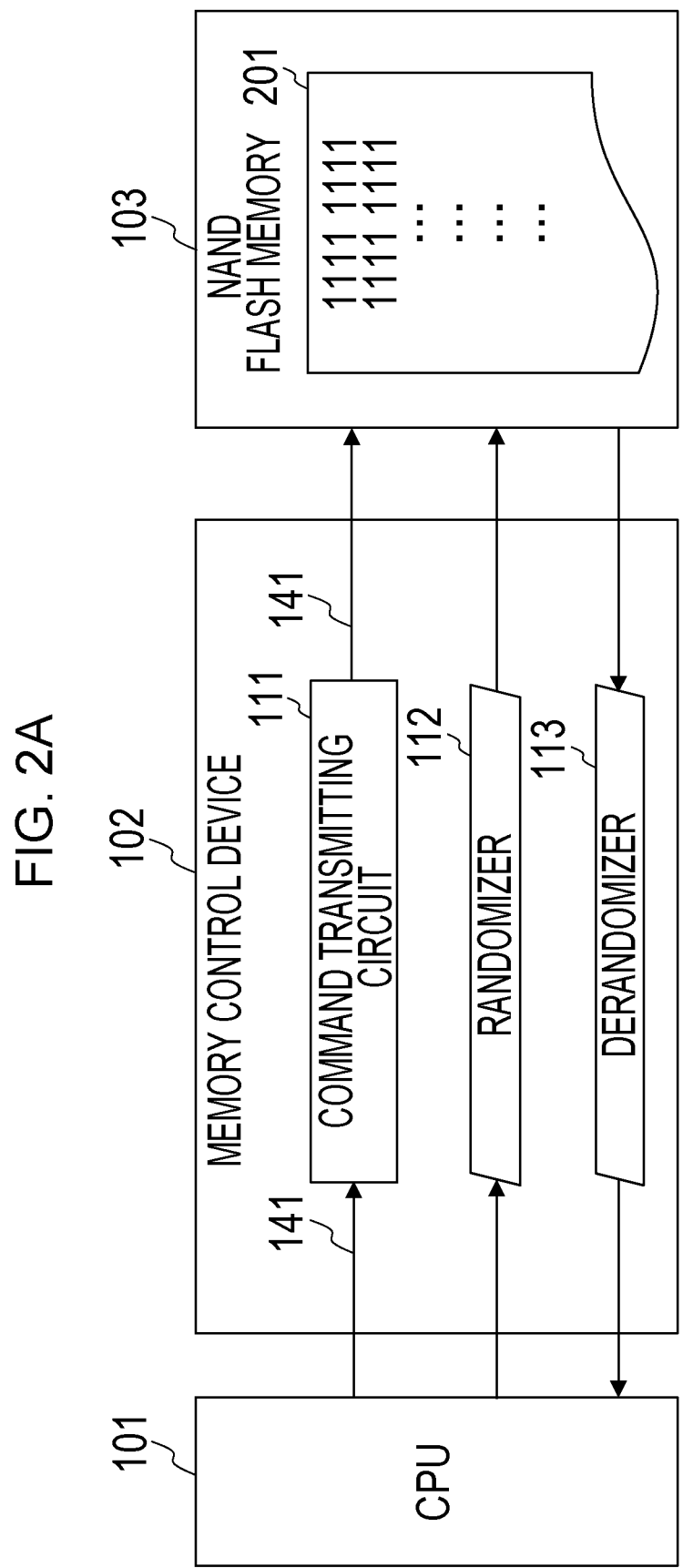

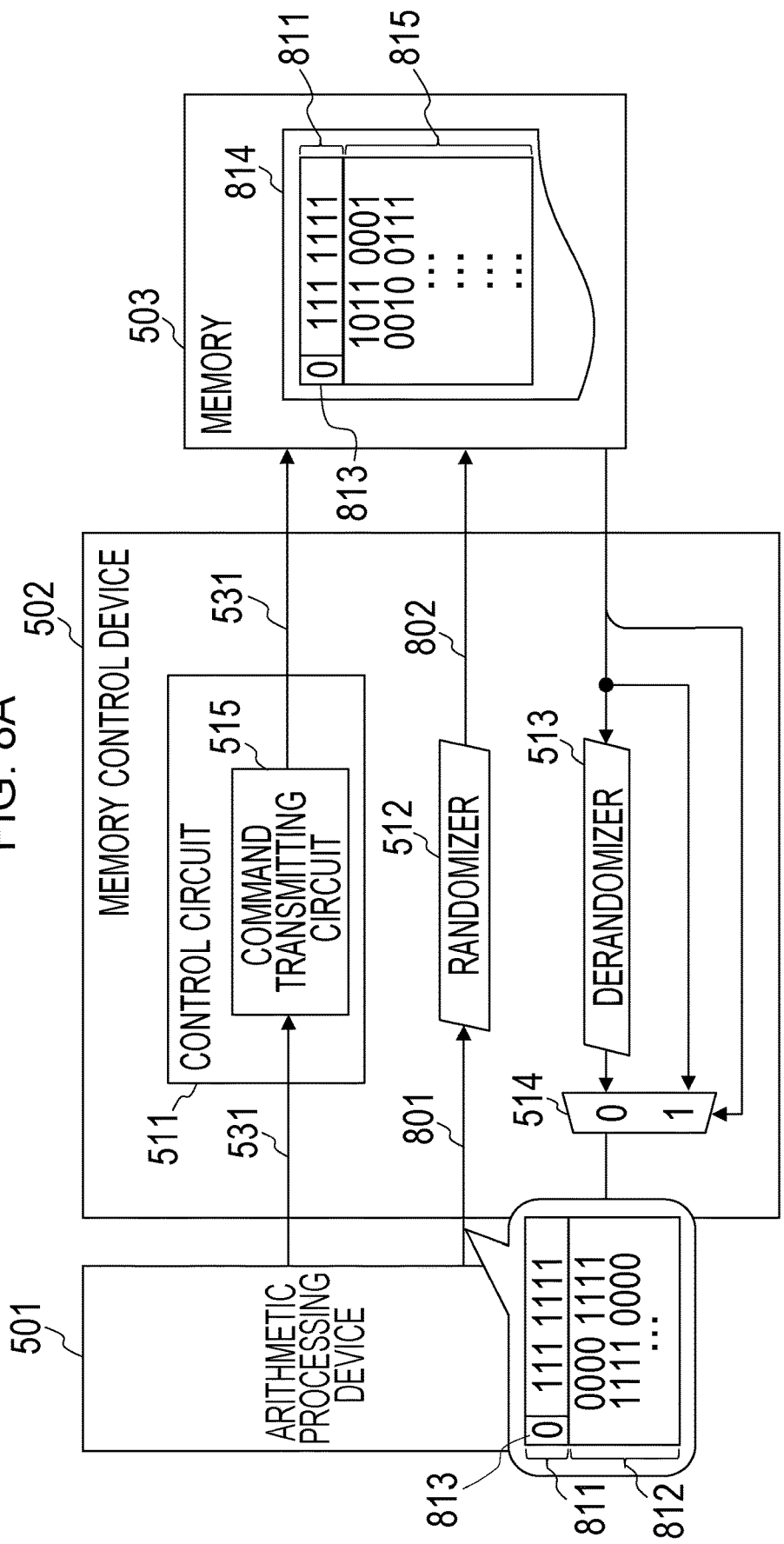

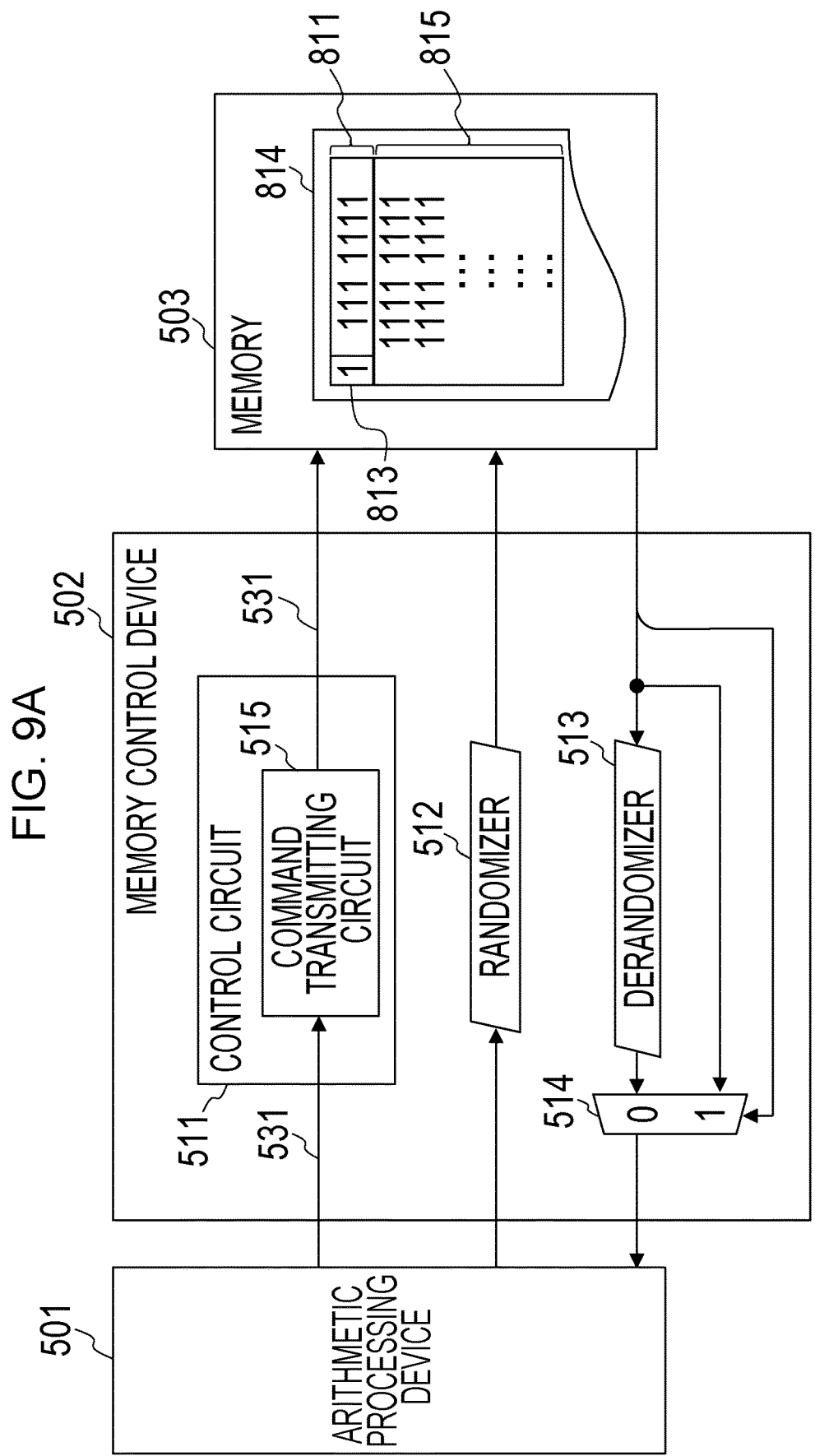

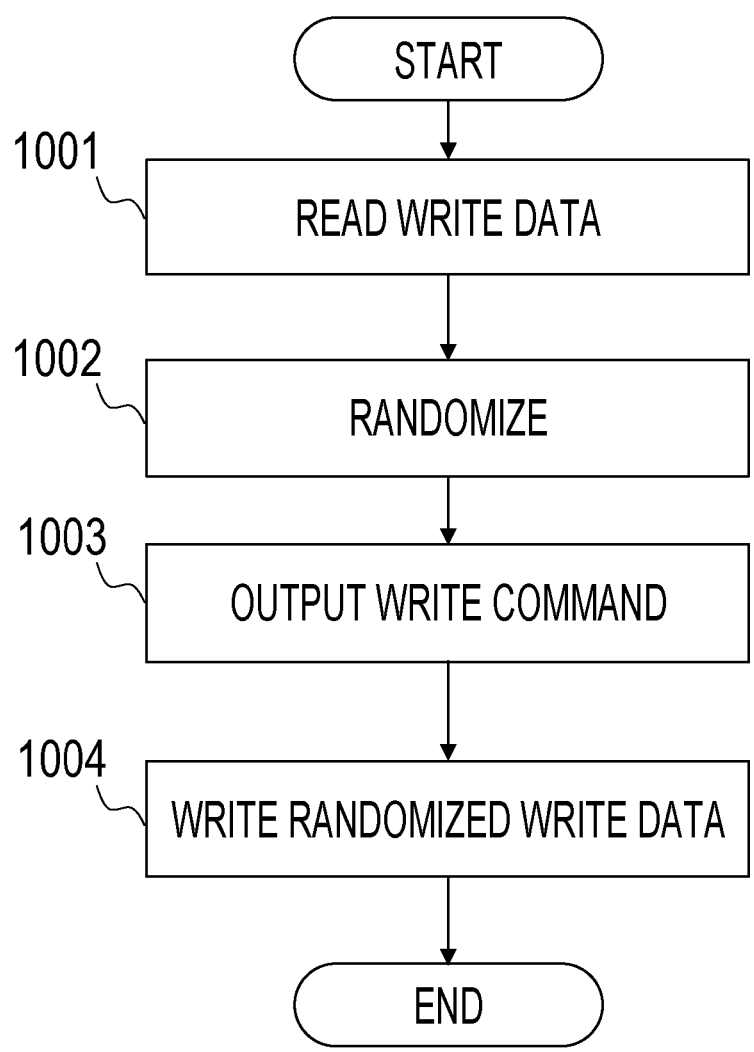

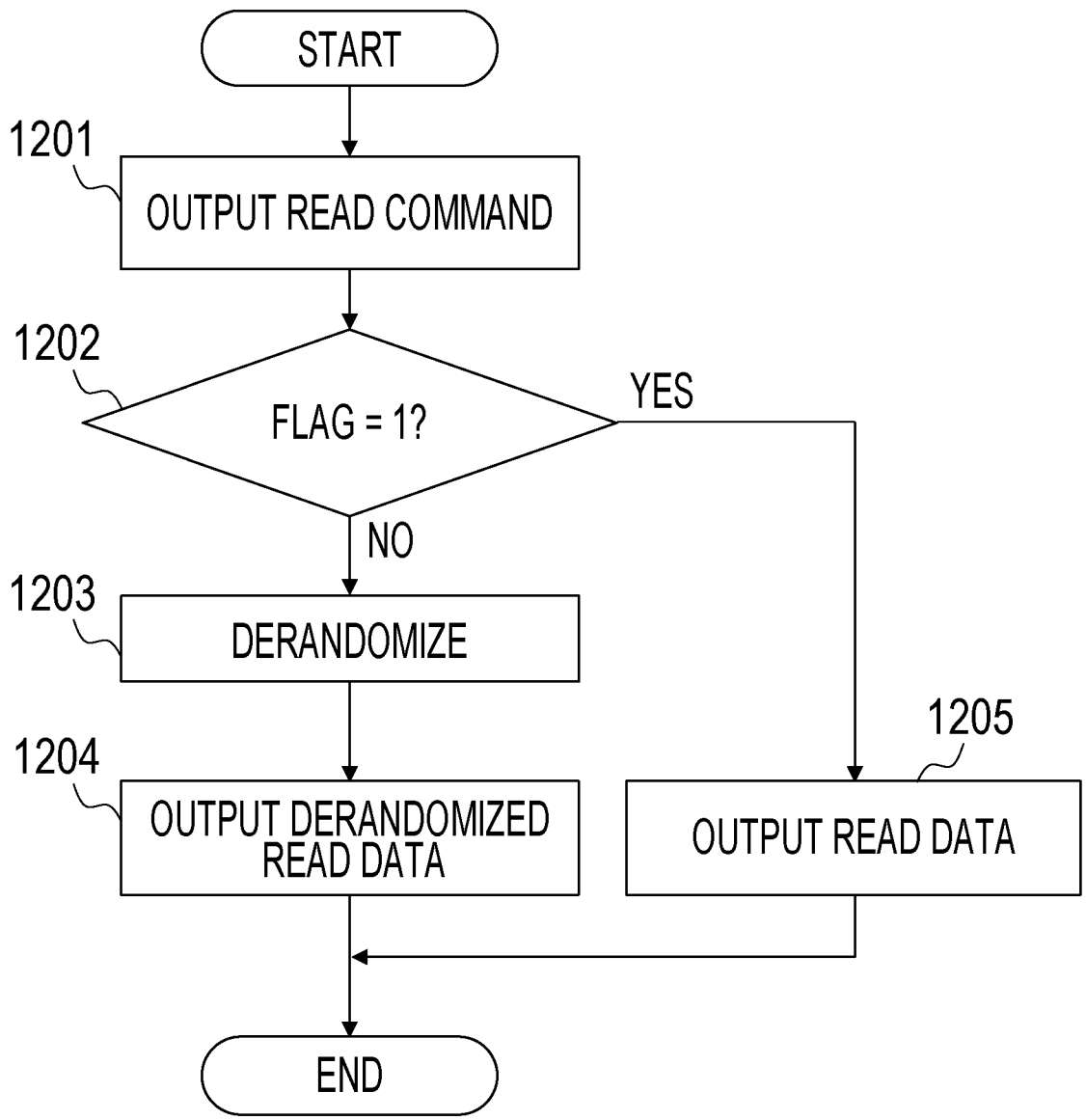

MEMORY CONTROL APPARATUS, INFORMATION PROCESSING APPARATUS, AND MEMORY CONTROL METHOD

CROSS-REFERENCE TO RELATED APPLICATION

This application is based upon and claims the benefit of priority of the prior Japanese Patent Application No. 2018-113253, filed on Jun. 14, 2018, the entire contents of which are incorporated herein by reference.

FIELD

The embodiment is related to a memory control apparatus, an information processing apparatus, and a memory control method.

BACKGROUND

In the case where a central processing unit (CPU) writes data to a NAND flash memory in an information processing apparatus, the CPU deletes data within the NAND flash memory and writes the new data. In this case, after the CPU executes a deletion process to secure reliability, the CPU may read data from the NAND flash memory and check whether or not the deletion process is properly executed. This deletion check is referred to as blank check.

In the NAND flash memory, blank data with all bits indicating a logical value "1" is often used as deleted data after the execution of the deletion process. Thus, the blank check is made to confirm whether or not all bits of the data read from the NAND flash memory indicate the logical value "1".

Regarding flash memories, a flash memory control circuit that deletes stored details in accordance with an auto-erase command, and a nonvolatile memory that repeatedly executes a delete operation and a delete verification operation are known (refer to, for example, Japanese Laid-open Patent Publication No. 11-260075 and Japanese Laid-open Patent Publication No. 2004-134085). A method of executing a delete verification operation on a flash memory device is also known (refer to, for example, Japanese Laid-open Patent Publication No. 2001-176276).

SUMMARY

According to an aspect of the embodiments, a memory control apparatus includes a randomizer configured to: randomize write data output from an arithmetic processing apparatus, and output the randomized write data to a memory; a derandomizer configured to: derandomize data read from the memory, and generate derandomized read data when a flag included in the data read from the memory indicates the randomized write data; and a selector configured to: select the derandomized read data and output the selected derandomized read data to the arithmetic processing apparatus when the flag indicates the randomized write data, and select the data read from the memory and output the selected read data to the arithmetic processing apparatus when the flag indicates deleted data.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 2A and 2B are diagrams illustrating a blank check;
FIGS. 8A and 8B are diagrams illustrating a write operation and a read operation;
FIGS. 9A and 9B are diagrams illustrating a blank check based on a flag;
FIG. 10 is a flowchart of the write operation;
FIG. 12 is a flowchart of the read operation.

DESCRIPTION OF EMBODIMENTS

An information processing apparatus having a NAND flash memory as a storage device includes a memory control apparatus for controlling the writing of data to the NAND flash memory and the reading of data from the NAND flash memory.

When the same bit value is continuously written in the writing of data to the NAND flash memory, bit reversal may easily occur. Thus, the memory control apparatus may randomize and write data. In this case, the memory control apparatus derandomizes data read from the NAND flash memory to restore the original data.

However, when the data read from the NAND flash memory is derandomized, it is difficult to execute a blank check.

The aforementioned problem occurs in not only a blank check executed on a NAND flash memory that is subjected to randomization in data writing but also a blank check executed on another type of memory that is subjected to randomization in data writing.

Hereinafter, an embodiment is described with reference to the accompanying drawings.

Figure 1:
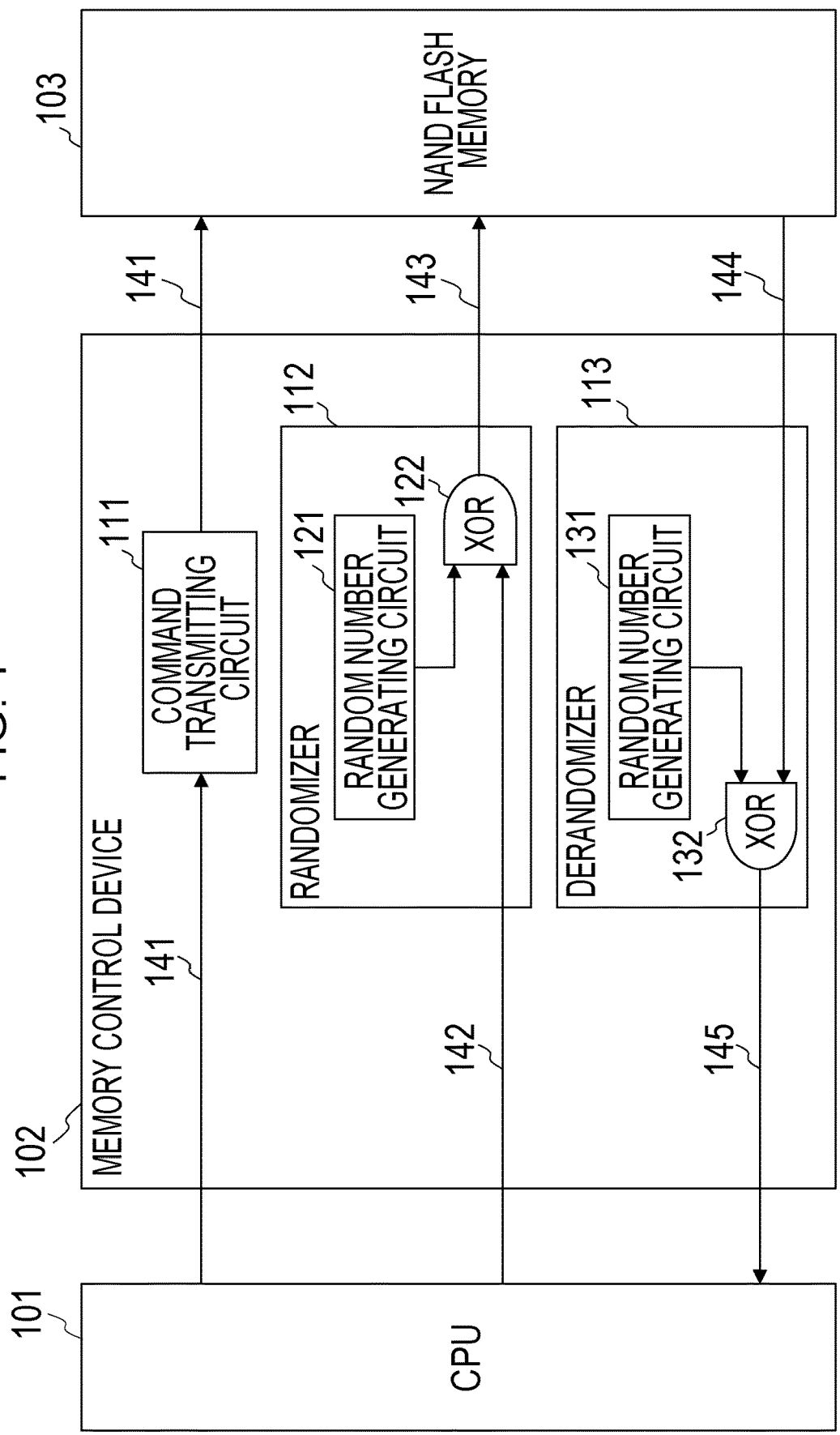
FIG. 1 is a configuration diagram of an information processing apparatus including a NAND flash memory.

FIG. 1 illustrates an example of a configuration of an information processing apparatus including a NAND flash memory. An information processing apparatus illustrated in FIG. 1 includes a CPU 101, a memory control apparatus 102, and a NAND flash memory 103. The memory control apparatus 102 includes a command transmitting circuit 111, a randomizer 112, and a derandomizer 113. The randomizer 112 includes a random number generating circuit 121 and an exclusive logical sum (XOR) circuit 122. The derandomizer 113 includes a random number generating circuit 131 and an XOR circuit 132.

In the writing of data to the NAND flash memory 103, the CPU 101 outputs a write command indicating a write request as a command 141 to the memory control apparatus 102 and outputs write data 142 to the memory control apparatus 102. The command transmitting circuit 111 outputs the write command to the NAND flash memory 103.

The random number generating circuit 121 of the randomizer 112 generates a pseudo random number such as a pseudorandom binary sequence (PRBS) from a page number of the write data 142 and an error-correction code (ECC) number of an ECC. The XOR circuit 122 calculates an exclusive logical sum of the write data 142 and the pseudo random number output by the random number generating circuit 121 to generate randomized write data 143 and outputs the generated randomized write data 143 to the NAND flash memory 103.

In the reading of data from the NAND flash memory 103, the CPU 101 outputs a read command indicating a read request as the command 141 to the memory control apparatus 102. The command transmitting circuit 111 outputs the read command to the NAND flash memory 103.

The random number generating circuit 131 of the derandomizer 113 generates a pseudo random number from the ECC number and a page number of read data 144 output from the NAND flash memory 103. The XOR circuit 132 calculates an exclusive logical sum of the read data 144 and the pseudo random number output by the random number generating circuit 131 to generate derandomized read data 145 and outputs the generated derandomized read data 145 to the CPU 101. The read data 145 matches the write data 142 before the randomization.

The randomizer 112 may randomize the write data 142 using encryption logic such as the Advanced Encryption Standard (AES) instead of a pseudo random number. In this case, the derandomizer 113 derandomizes the read data 144 using decryption logic instead of a pseudo random number.

Figure 2B:
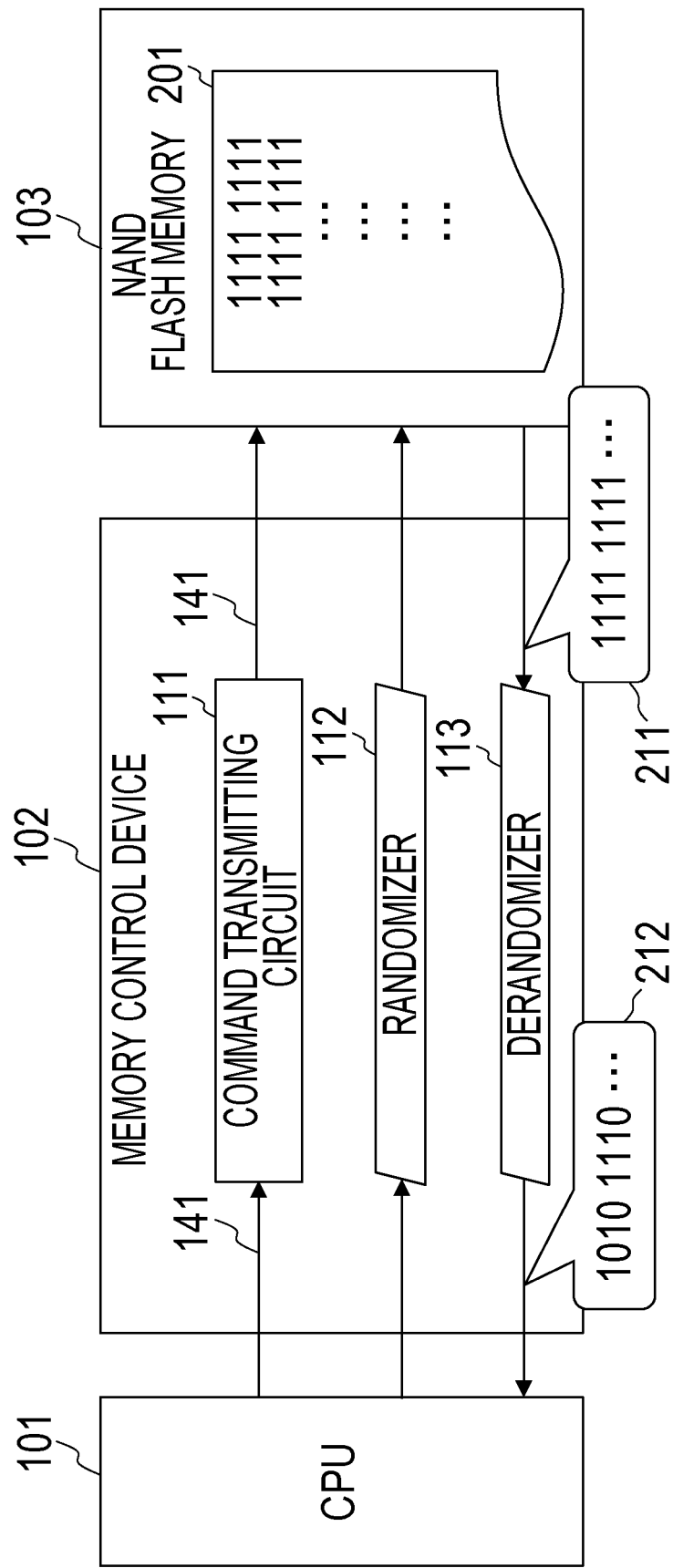

FIGS. 2A and 2B illustrate an example of a blank check in the information processing apparatus illustrated in FIG. 1. FIG. 2A illustrates an example of an operation of deleting data within the NAND flash memory 103. In the deletion of the data, the CPU 101 outputs a delete command indicating a delete request as the command 141 to the memory control apparatus 102. The command transmitting circuit 111 outputs the delete command to the NAND flash memory 103. By executing this, logical values "1" are written over all bit values of a page 201 within the NAND flash memory 103, or data of the page 201 is changed to blank data.

FIG. 2B illustrates an example of an operation of reading blank data from the NAND flash memory 103. In the reading of the blank data from the NAND flash memory 103, the CPU 101 outputs a read command as the command 141 to the memory control apparatus 102, and the command transmitting circuit 111 outputs the read command to the NAND flash memory 103.

The derandomizer 113 derandomizes blank data 211 output from the NAND flash memory 103 to generate derandomized blank data 212 and outputs the generated derandomized blank data 212 to the CPU 101. In this case, some bit values of the derandomized blank data 212 are changed from logical values "1" to logical values "0". It is, therefore, very difficult to check whether or not the delete process is properly executed.

Figure 3:
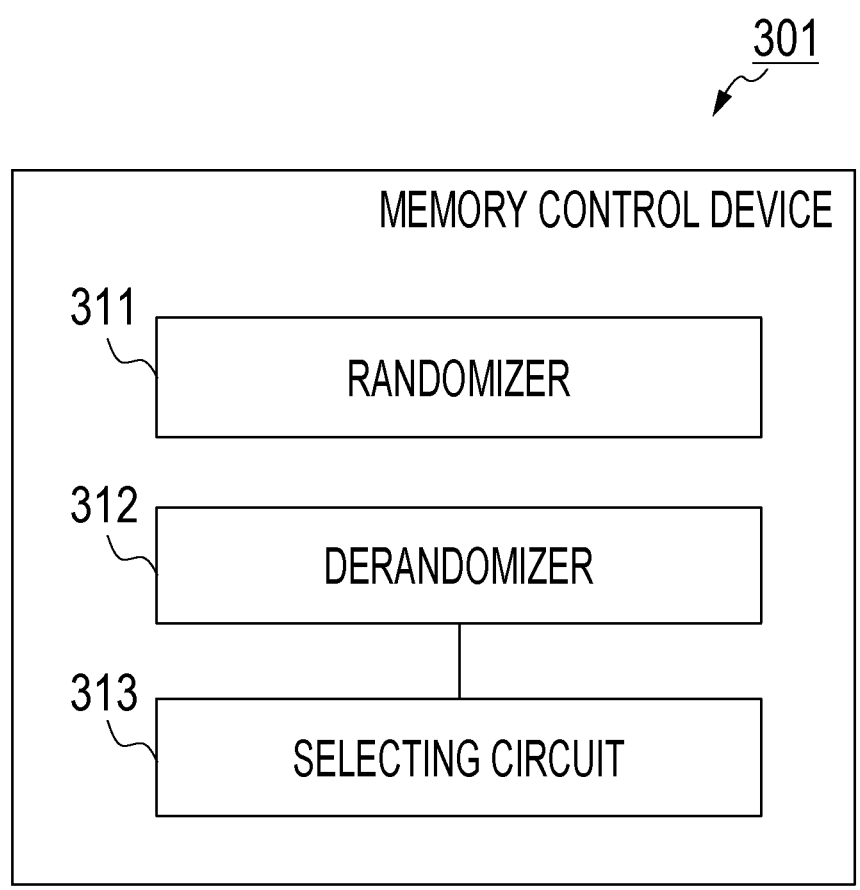
FIG. 3 is a configuration diagram of a memory control apparatus.

FIG. 3 illustrates an example of a configuration of the memory control apparatus according to the embodiment. A memory control apparatus 301 illustrated in FIG. 3 includes a randomizer 311, a derandomizer 312, and a selecting circuit 313.

Figure 4:
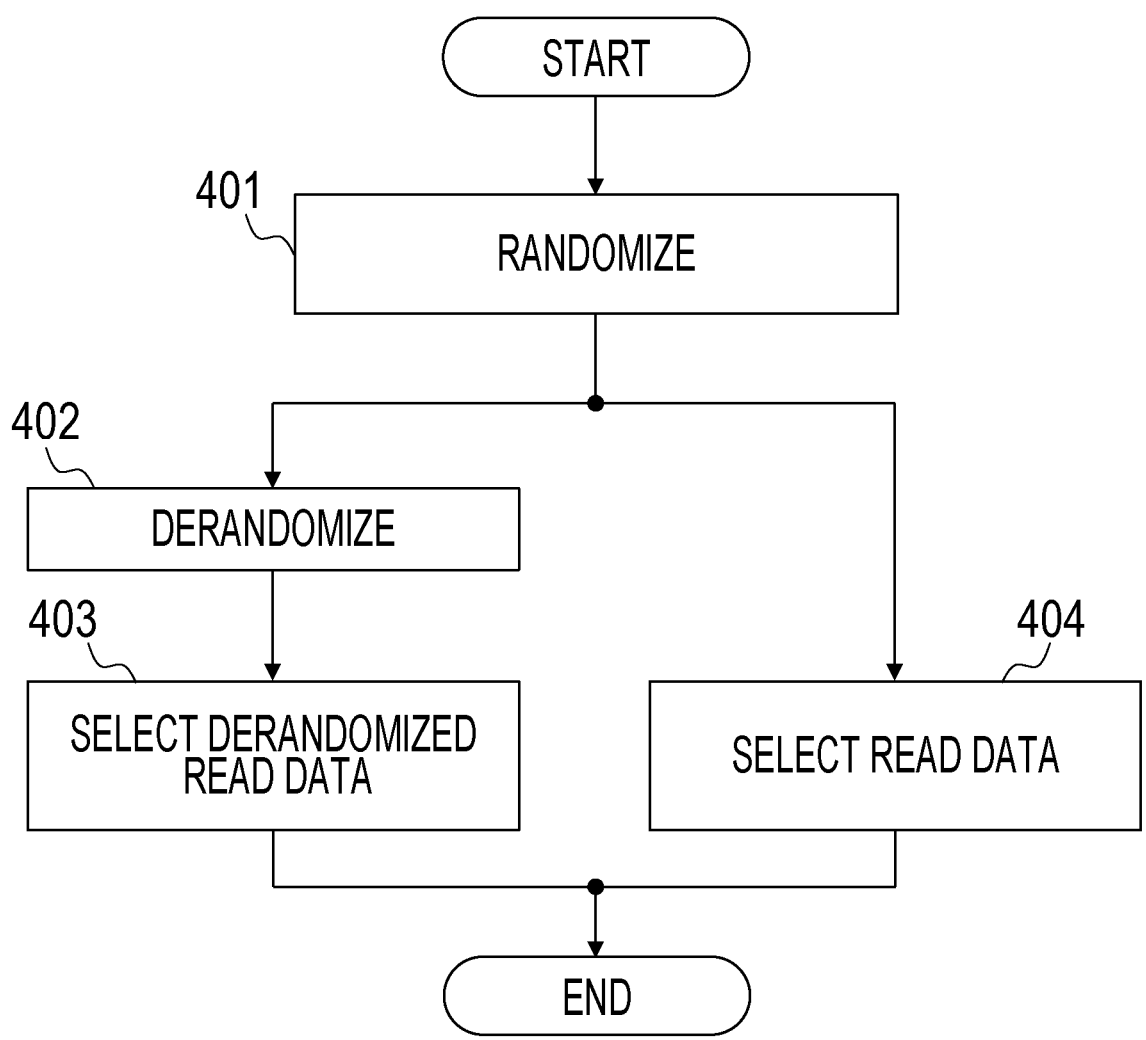
FIG. 4 is a flowchart of a memory control method.

FIG. 4 is a flowchart of an example of a memory control method to be executed by the memory control apparatus 301 illustrated in FIG. 3. First, the randomizer 311 randomizes write data output from an arithmetic processing apparatus and outputs the randomized write data to a memory (in step 401).

When a flag included in data read from the memory indicates the randomized write data, the derandomizer 312 generates derandomized read data (in step 402). In this case, the derandomizer 312 derandomizes data read from the memory to generate the derandomized read data.

When the flag included in the data read from the memory indicates the randomized write data, the selecting circuit 313 selects the derandomized read data and outputs the selected derandomized read data to the arithmetic processing apparatus (in step 403). On the other hand, when the flag indicates deleted data, the selecting circuit 313 selects the data read from the memory and outputs the selected read data to the arithmetic processing apparatus (in step 404).

In the information processing apparatus that randomizes data and writes the randomized data to the memory, the memory control apparatus 301 illustrated in FIG. 3 may check deletion from the memory.

Figure 5:
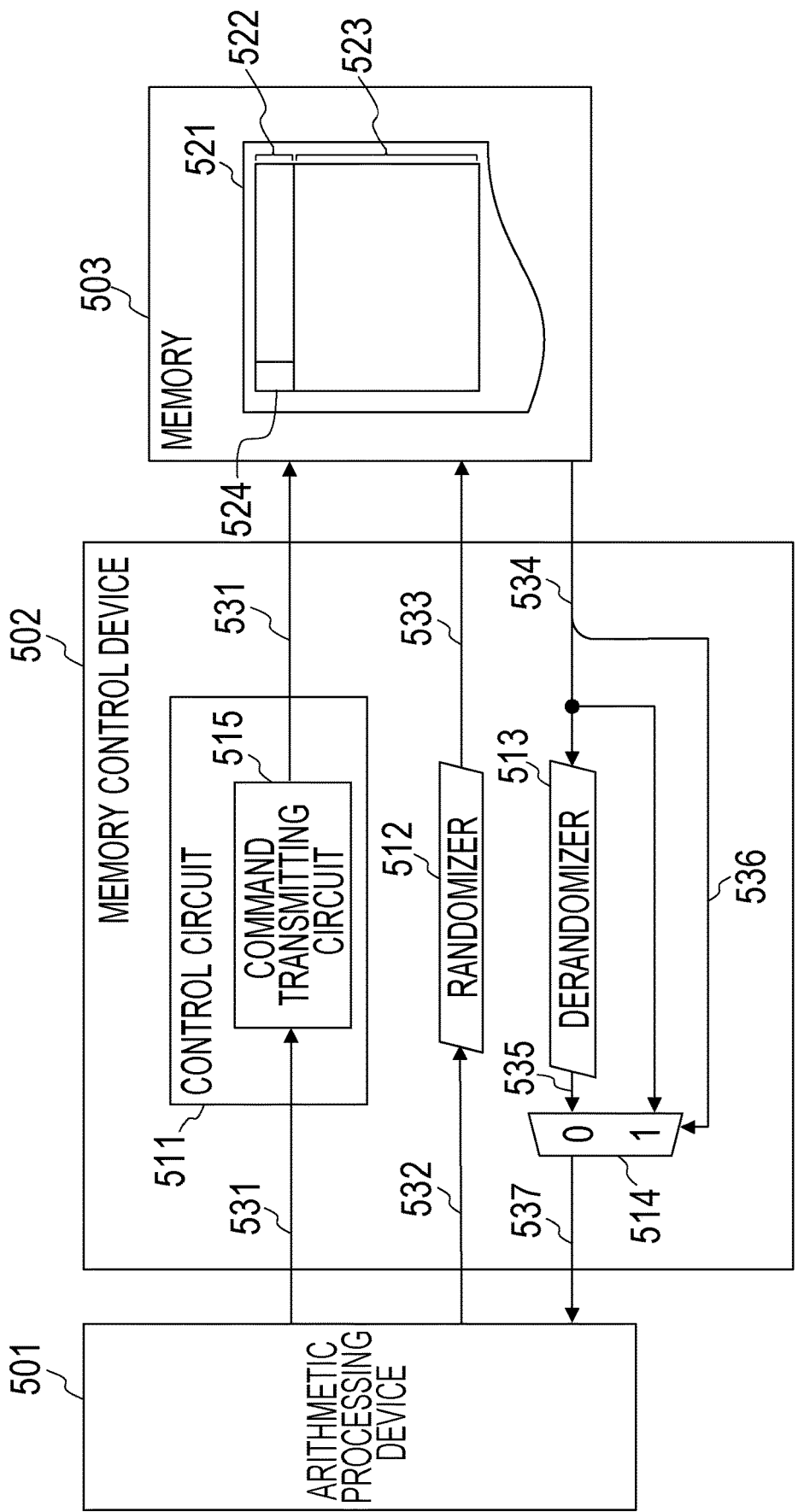
FIG. 5 is a configuration diagram of the information processing apparatus.

FIG. 5 illustrates an example of a configuration of an information processing apparatus including the memory control apparatus 301 illustrated in FIG. 3. An information processing apparatus illustrated in FIG. 5 is a personal computer, a tablet, a smartphone, a server, or the like and includes an arithmetic processing apparatus 501, a memory control apparatus 502, and a memory 503.

The arithmetic processing apparatus 501 is a processor such as a CPU, a microprocessor, or a digital signal processor. The memory 503 is a nonvolatile memory such as a NAND flash memory or a NOR flash memory and is installed as an external storage device such as a cache memory or a solid state drive (SSD). The memory 503 may be a magnetoresistive random access memory (MRAM).

The memory control apparatus 502 corresponds to the memory control apparatus 301 illustrated in FIG. 3 and includes a control circuit 511, a randomizer 512, a derandomizer 513, and a selecting circuit 514. The control circuit 511 includes a command transmitting circuit 515. The randomizer 512, the derandomizer 513, and the selecting circuit 514 correspond to the randomizer 311 illustrated in FIG. 3, the derandomizer 312 illustrated in FIG. 3, and the selecting circuit 313 illustrated in FIG. 3, respectively. As the randomizer 512 and the derandomizer 513, the randomizer 112 illustrated in FIG. 1 and the derandomizer 113 illustrated in FIG. 1 may be used.

The memory 503 stores a page 521. The page 521 includes reserved data 522 and a data body 523. The data body 523 is user data. The reserved data 522 is management information to be used to manage the data body 523. The reserved data 522 includes a flag 524.

The flag 524 is, for example, the bit value of one bit and indicates whether data of the page 521 is deleted data or randomized write data. When the flag 524 has a logical value "1", the flag 524 indicates deleted data. When the flag 524 has a logical value "0", the flag 524 indicates randomized write data.

In the writing of data to the memory 503, the arithmetic processing apparatus 501 outputs a write command indicating a write request as a command 531 to the memory control apparatus 502 and outputs write data 532 to the memory control apparatus 502. The randomizer 512 randomizes the write data 532 to generate randomized write data 533 and outputs the generated randomized write data 533 to the memory 503.

When the control circuit 511 receives a write command from the arithmetic processing apparatus 501, the control circuit 511 writes the randomized write data 533 including the flag 524 having the logical value "0" to the memory 503. In this case, the command transmitting circuit 515 outputs the write command to the memory 503.

Figure 6:
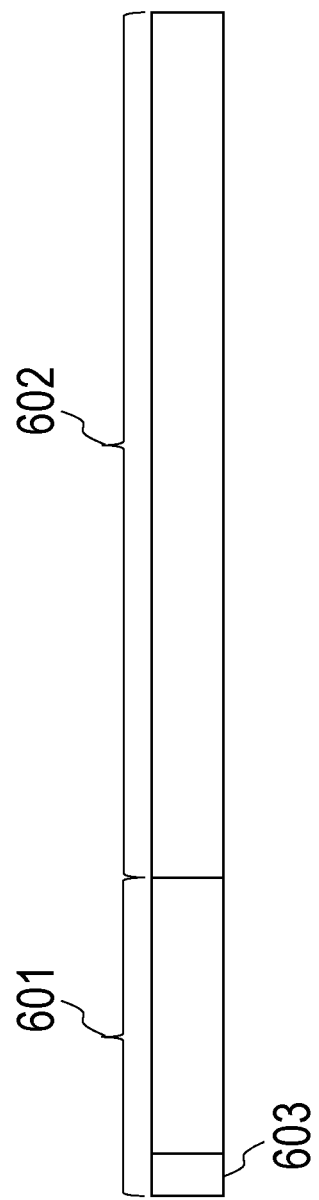
FIG. 6 is a diagram illustrating write data.

FIG. 6 illustrates an example of the write data 532. The write data 532 illustrated in FIG. 6 includes reserved data 601 and a data body 602. The reserved data 601 includes a flag 603 at the top of the reserved data 601. For example, the reserved data 601 is management information of several tens of bytes, and the data body 602 is user data of several kilobytes to several tens of kilobytes.

A randomization process to be executed by the randomizer 512 is applied to the data body 602 and is not applied to the reserved data 601. The flag 603 has a logical value "0" and the reserved data 601 is written as the reserved data 522 to the memory 503. On the other hand, the data body 602 is written as the data body 523 to the memory 503 after being randomized by the randomizer 512.

Figure 7:
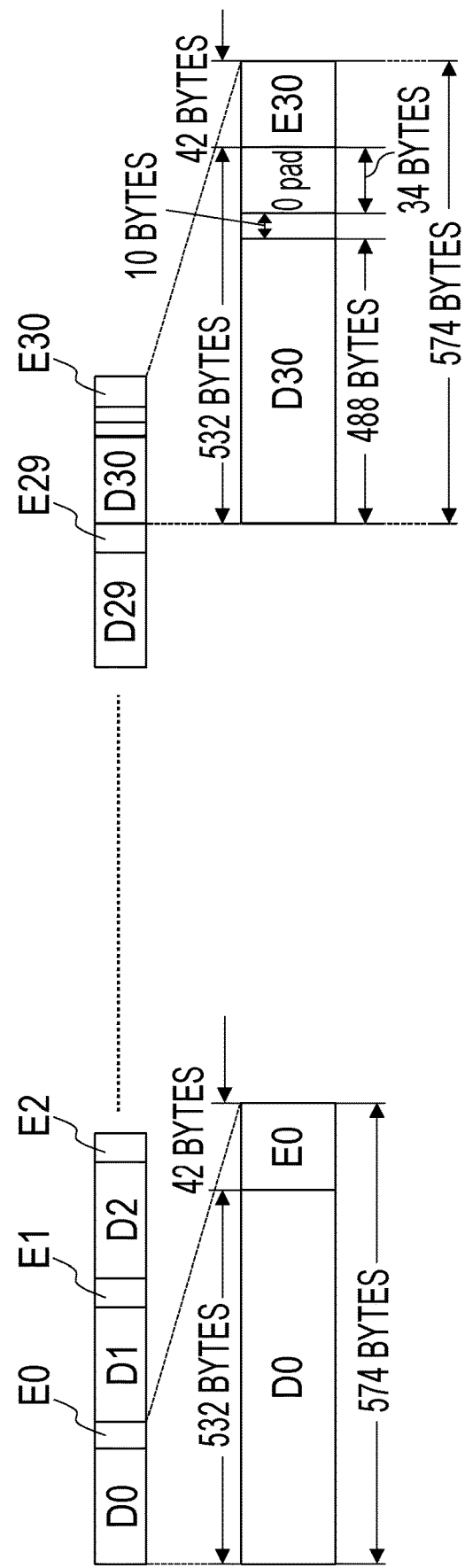
FIG. 7 is a diagram illustrating write data including ECCs.

FIG. 7 illustrates an example of the write data 532 including ECCs. The write data 532 illustrated in FIG. 7 includes data D0 to D30 and data E0 to E30. The data Di (i=0 to 30) includes reserved data and data bodies. Each data Ei indicates ECCs for the data Di. In this case, the top data D0 also includes reserved data, and a flag that is the same as or similar to the flag 603 illustrated in FIG. 6 is included in a top portion of the reserved data. The randomization process to be executed by the randomizer 512 is applied to the data bodies included in the data Di and the data Ei and is not applied to the reserved data.

The data Di (i=0 to 29) is of 574 bytes, while the data D30 is of 488 bytes. To match the size of the data D30 with the size of the other data Di, invalid data of 10 bytes and 0pad of 34 bytes are added to the data D30. On the other hand, the data Ei (i=0 to 30) is of 42 bytes.

In the deletion of data within the memory 503, the arithmetic processing apparatus 501 outputs a delete command indicating a delete request as the command 531 to the memory control apparatus 502. When the control circuit 511 receives the delete command from the arithmetic processing apparatus 501, the control circuit 511 writes deleted data including the flag 524 having the logical value "1" to the memory 503. In this case, the command transmitting circuit 515 outputs the delete command to the memory 503. For example, as the deleted data, blank data with all bits having a logical value "1" is used.

In the reading of data from the memory 503, the arithmetic processing apparatus 501 outputs a read command indicating a read request as the command 531 to the memory control apparatus 502. When the control circuit 511 receives the read command from the arithmetic processing apparatus 501, the control circuit 511 reads data of the page 521 from the memory 503. In this case, the command transmitting circuit 515 outputs the read command to the memory 503.

The memory 503 outputs the data of the page 521 as read data 534. The derandomizer 513 determines whether or not the read data 534 is to be derandomized, based on the logical value of the flag 524 included in the read data 534.

When the flag 524 included in the read data 534 has the logical value "0", the derandomizer 513 derandomizes the read data 534 to generate derandomized read data 535. At this time, the derandomization process to be executed by the derandomizer 513 is applied to the data body 523 and is not applied to the reserved data 522. On the other hand, when the flag 524 included in the read data 534 has the logical value "1", the derandomizer 513 does not execute the derandomization process.

The derandomizer 513 outputs the derandomized read data 535 to one of two input ports of the selecting circuit 514. The read data 534 passes through the derandomizer 513 and is input to the other input port of the selecting circuit 514, and the flag 524 included in the read data 534 is input as a control signal 536 to the selecting circuit 514.

When the control signal 536 has the logical value "0", the selecting circuit 514 selects the derandomized read data 535 as read data 537 and outputs the read data 537 to the arithmetic processing apparatus 501. On the other hand, when the control signal 536 has the logical value "1", the selecting circuit 514 selects the read data 534 as the read data 537 and outputs the read data 537 to the arithmetic processing apparatus 501.

Since the flag 524 indicating whether or not the data of the page 521 is already deleted is included in the page 521 stored in the memory 503, the memory control apparatus 502 may automatically control whether the memory control apparatus 502 causes the read data 534 to pass through the derandomizer 513. When the memory control apparatus 502 reads deleted data with all bits having a logical value "1", the memory control apparatus 502 causes the deleted data to pass through the derandomizer 513 and outputs the deleted data to the arithmetic processing apparatus 501. Thus, the arithmetic processing apparatus 501 may execute a blank check.

Figure 8B:
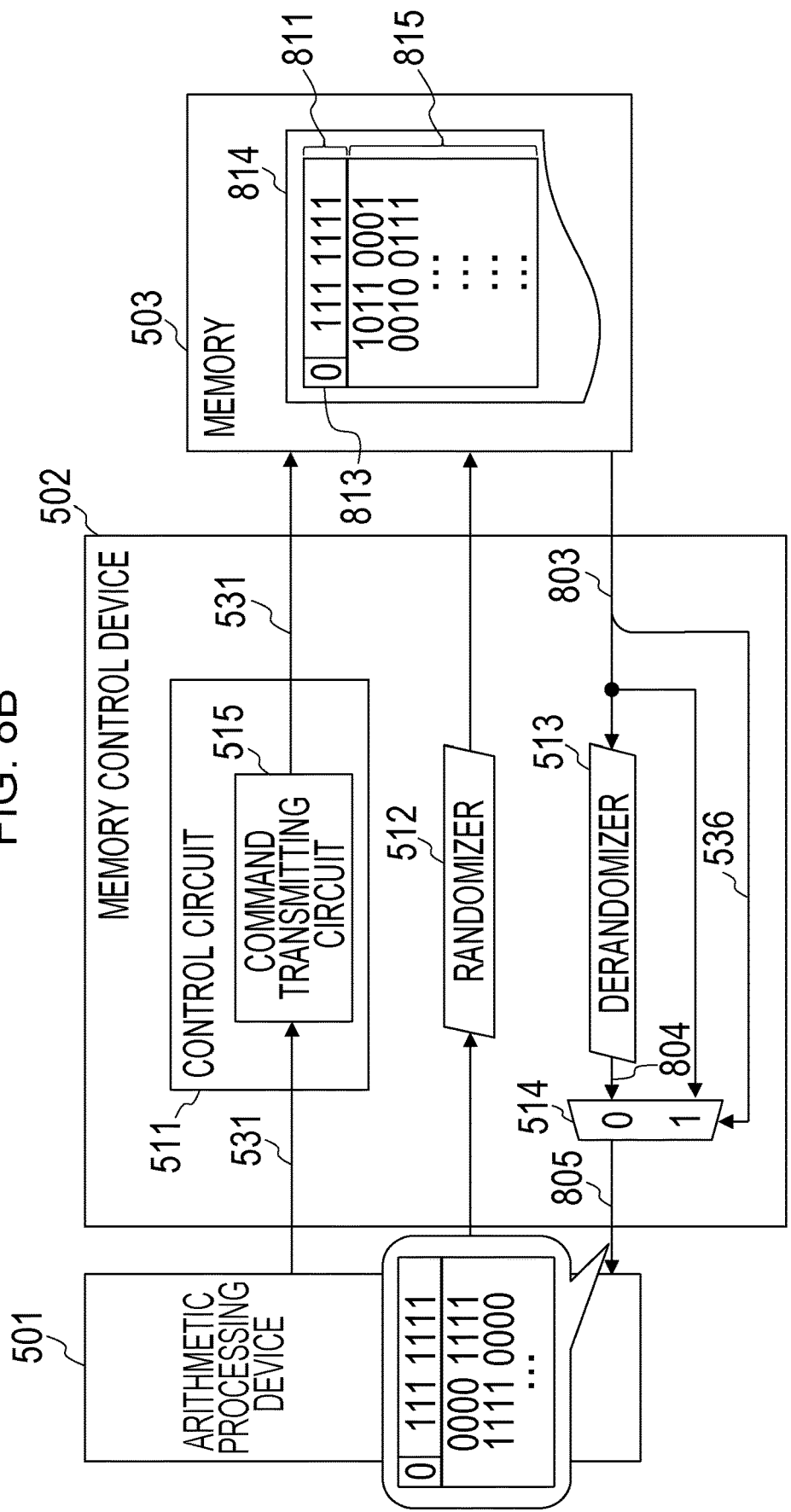

FIGS. 8A and 8B illustrate examples of a write operation and a read operation in the information processing apparatus illustrated in FIG. 5. FIG. 8A illustrates an example of an operation of writing user data to the memory 503. In the writing of user data to the memory 503, the arithmetic processing apparatus 501 outputs a write command as the command 531 to the memory control apparatus 502 and outputs write data 801 to the memory control apparatus 502. The write data 801 includes reserved data 811 and a data body 812. A flag 813 included in a top portion of the reserved data 811 has a logical value "0".

The randomizer 512 randomizes the data body 812 of the write data 801 to generate randomized write data 802 and outputs the write data 802 to the memory 503. Then, the command transmitting circuit 515 of the control circuit 511 outputs the write command to the memory 503. By executing this, the reserved data 811 and a randomized data body 815 that are included in the write data 802 are written to a page 814 within the memory 503.

FIG. 8B illustrates an example of an operation of reading user data from the memory 503. In the reading of user data from the 503, the arithmetic processing apparatus 501 outputs a read command as the command 531 to the memory control apparatus 502. The command transmitting circuit 515 outputs the read command to the memory 503. The memory 503 outputs data of the page 814 as read data 803.

Since the flag 813 included in the read data 803 has the logical value "0", the derandomizer 513 derandomizes the data body 815 of the read data 803 to generate derandomized read data 804 and outputs the generated derandomized read data 804 to the selecting circuit 514. In addition, the flag 813 included in the read data 803 is input as the control signal 536 to the selecting circuit 514.

The selecting circuit 514 selects the derandomized read data 804 as read data 805 in accordance with the control signal 536 indicating the logical value "0" and outputs the selected read data 805 to the arithmetic processing apparatus 501. Thus, the arithmetic processing apparatus 501 may acquire the same data as the write data 801.

Figure 9B:
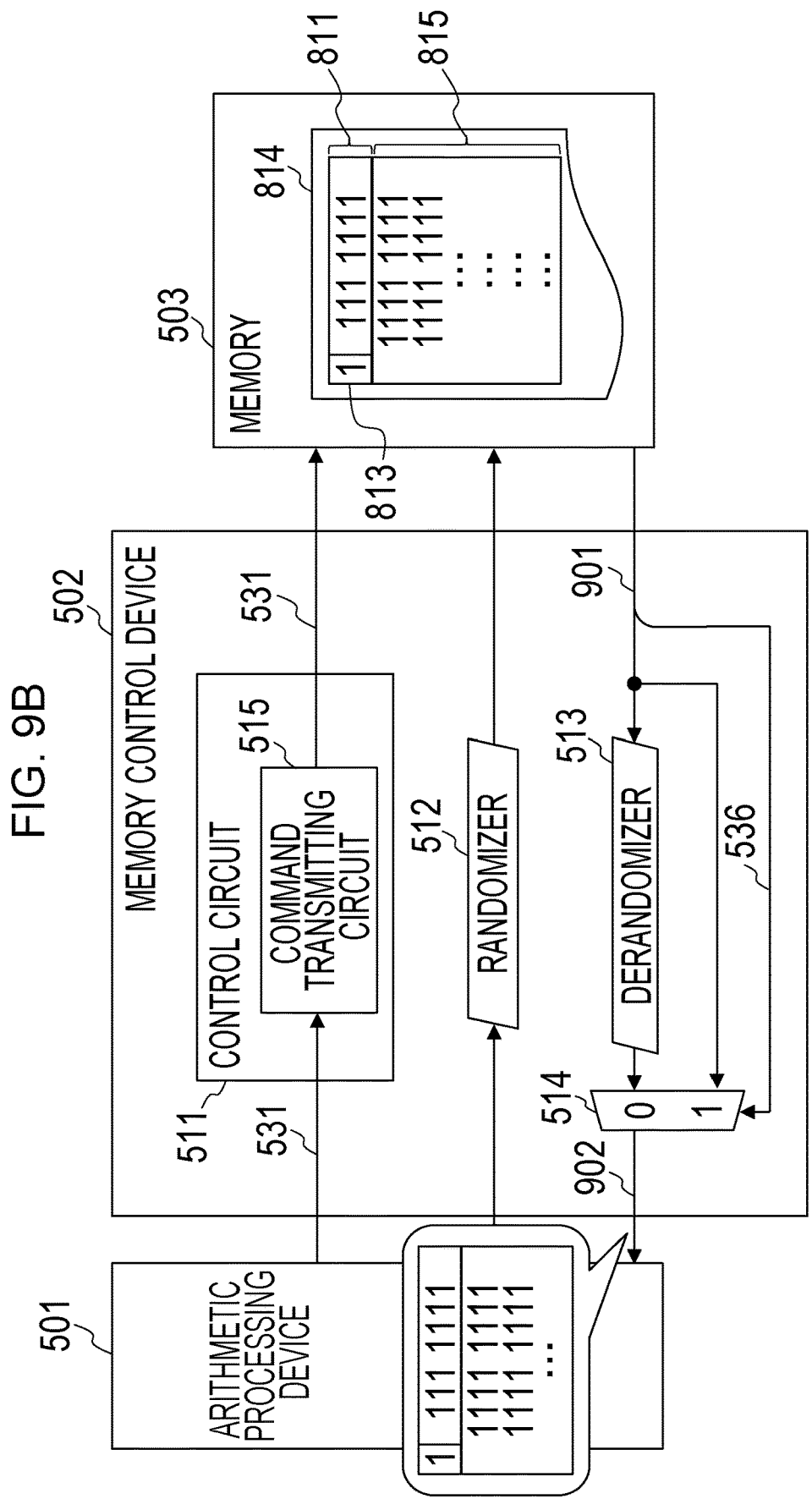

FIGS. 9A and 9B illustrate an example of a blank check that is based on a flag and to be executed by the information processing apparatus illustrated in FIG. 5. FIG. 9A illustrates an example of an operation of deleting data within the memory 503. In the deletion of data within the memory 503, the arithmetic processing apparatus 501 outputs a delete command as the command 531 to the memory control apparatus 502. The command transmitting circuit 515 of the control circuit 511 outputs the delete command to the memory 503. In the memory 503, logical values "1" are written over all bit values of the reserved data 811 and all bit values of the data body 815. By executing this, the data of the page 814 is changed to blank data, and the bit value of the flag 813 is also changed from the logical value "0" to a logical value "1".

FIG. 9B illustrates an example of an operation of reading blank data from the memory 503. In the reading of the blank data from the 503, the arithmetic processing apparatus 501 outputs a read command as the command 531 to the memory control apparatus 502. The command transmitting circuit 515 outputs the read command to the memory 503. The memory 503 outputs the blank data of the page 814 as read data 901.

Since the flag 813 included in the read data 901 has the logical value "1", the derandomizer 513 does not execute the derandomization process. The flag 813 included in the read data 901 is input as the control signal 536 to the selecting circuit 514.

The selecting circuit 514 selects the read data 901 as read data 902 in accordance with the control signal 536 indicating the logical value "1" and outputs the selected read data 902 to the arithmetic processing apparatus 501. Since the arithmetic processing apparatus 501 acquires the blank data of the page 814, the arithmetic processing apparatus 501 may check whether or not the delete process has been properly executed.

As illustrated in FIG. 8A, in the case where the memory control apparatus 502 writes the user data to the memory 503, the memory control apparatus 502 writes the randomized write data 802 including the flag 813 having the logical value "0" to the page 814. In addition, as illustrated in FIG. 9A, in the case where the memory control apparatus 502 deletes data within the memory 503, the memory control apparatus 502 writes blank data including the flag 813 having logical value "1" to the page 814.

Thus, the memory control apparatus 502 may determine whether the read data is user data or blank data based on the logical value of the flag 813 included in the data read from the memory 503.

Since the same logical value "1" as a bit value of blank data is used as the flag 813 indicating the blank data, the memory control apparatus 502 may set the logical value indicating the blank data to the flag 813 by simply outputting a delete command to the memory 503.

FIG. 10 is a flowchart of an example of the write operation to be executed by the memory control apparatus 502 illustrated in FIG. 5. First, the memory control apparatus 502 receives the write data 532 from the arithmetic processing apparatus 501 (in step 1001). Then, the randomizer 512 randomizes the data body of the write data 532 to generate the randomized write data 533 (in step 1002).

Then, the control circuit 511 outputs a write command to the memory 503 (in step 1003). The randomizer 512 writes the randomized write data 533 to the page 521 within the memory 503 (in step 1004). The randomized write data 533 includes the reserved data 522 and the randomized data body 523. The reserved data 522 includes the flag 524 having the logical value "0".

Figure 11:
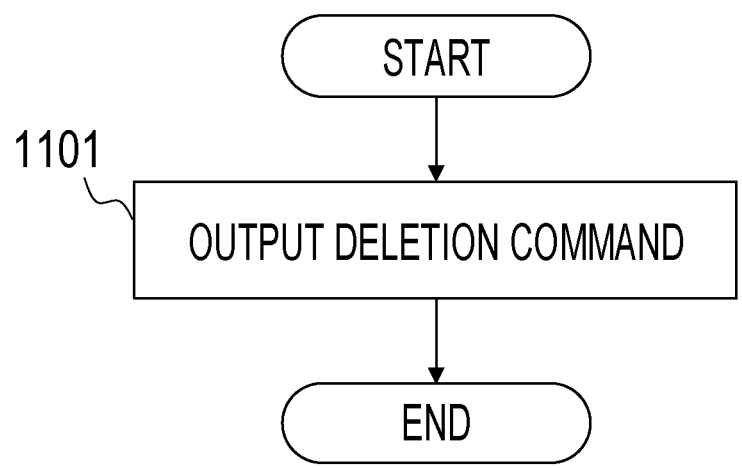
FIG. 11 is a flowchart of a delete operation.

FIG. 11 is a flowchart of an example of a delete operation to be executed by the memory control apparatus 502 illustrated in FIG. 5. The control circuit 511 outputs a delete command to the memory 503 (in step 1101). By executing this, blank data is written over data of the page 521 stored in the memory 503.

FIG. 12 is a flowchart of an example of the read operation to be executed by the memory control apparatus 502 illustrated in FIG. 5. First, the control circuit 511 outputs a read command to the memory 503 and reads the data of the page 521 as the read data 534 (in step 1201). Then, the derandomizer 513 checks the flag 524 included in the read data 534 (in step 1202).

When the flag 524 has the logical value "0" (NO in step 1202), the derandomizer 513 derandomizes a data body of the read data 534 to generate derandomized read data 535 (in step 1203). Then, the selecting circuit 514 selects the derandomized read data 535 as the read data 537 in accordance with the control signal 536 indicating the logical value "0" and outputs the selected read data 537 to the arithmetic processing apparatus 501 (in step 1204).

On the other hand, when the flag 524 has the logical value "1" (YES in step 1202), the selecting circuit 514 selects the read data 534 as the read data 537 in accordance with the control signal 536 indicating the logical value "1" and outputs the selected read data 537 to the arithmetic processing apparatus 501 (in step 1205).

The configurations of the information processing apparatus illustrated in FIGS. 1 and 5 are examples only. Some constituent elements of the information processing apparatus may be omitted or changed based on the use or conditions of the information processing apparatus.

Each of the information processing apparatuses may include input devices such as a keyboard and a pointing device or an output device such as a display device. In addition, each of the information processing apparatuses may include a medium driving device such as a compact disc-read only memory (CD-ROM) drive or a communication device such as a network interface card.

When data with all bits indicating a logical value "0" is used as the deleted data, a flag with a changed logical value may be used as the flag 524 illustrated in FIG. 5. In this case, the logical value "1" is used as the flag 524 indicating the randomized write data, and the logical value "0" is used as the flag 524 indicating the deleted data.

The configuration of the memory control apparatus 301 illustrated in FIG. 3 is an example only. Some constituent elements of the memory control apparatus 301 may be omitted or changed based on the use or conditions of the memory control apparatus 301.

The flowcharts illustrated in FIGS. 4 and 10 to 12 are examples only. Some processes of the flowcharts may be omitted or changed based on the configurations or conditions of the memory control apparatus 301 or the information processing apparatus.

The blank checks illustrated in FIGS. 2 and 9 are examples only. The operations for the blank checks may be changed based on the configurations or conditions of the information processing apparatus. The write and read operations illustrated in FIG. 8 are examples only. The write and read operations may be changed based on the configurations or conditions of the information processing apparatus.

The write data illustrated in FIGS. 6 and 7 is examples only. The formats of the write data may be changed based on the configurations or conditions of the information processing apparatus.

The disclosed embodiment and the advantages of the embodiment are described above in detail. Persons skilled in the art may make various changes, additions, and omissions without departing from the scope of the appended claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A memory control apparatus comprising:
a randomizer configured to:
randomize write data output from an arithmetic processing apparatus, and
output the randomized write data to a memory;
a derandomizer configured to:
derandomize data read from the memory, and
generate derandomized read data when a flag included in the data read from the memory indicates the randomized write data; and
a selector configured to:
select the derandomized read data and output the selected derandomized read data to the arithmetic processing apparatus when the flag indicates the randomized write data, and
select the data read from the memory and output the selected data read from the memory to the arithmetic processing apparatus when the flag indicates deleted data.

2. The memory control apparatus according to claim 1, further comprising:
a control circuit configured to:
write randomized write data including a flag having a first logical value to the memory when the control circuit receives a write request from the arithmetic processing apparatus, and
write deleted data including a flag having a second logical value to the memory when the control circuit receives a delete request from the arithmetic processing apparatus,
wherein when the flag included in the data read from the memory has the first logical value, the derandomizer is configured to:
derandomize the data read from the memory, and
generate the derandomized read data, and
wherein when the flag included in the data read from the memory has the first logical value, the selector is configured to:
select the derandomized read data, and
output the selected derandomized read data to the arithmetic processing apparatus, and
wherein when the flag included in the data read from the memory has the second logical value, the selector is configured to:
select the data read from the memory, and
output the selected data read from the memory to the arithmetic processing apparatus.

3. The memory control apparatus according to claim 2, wherein all logical values included in the deleted data are equal to the second logical value.

4. The memory control apparatus according to claim 1, wherein the memory is a NAND flash memory.

5. An information processing apparatus comprising:
an arithmetic processing apparatus;
a memory coupled to the arithmetic processing apparatus; and
a memory control apparatus coupled to the memory, the memory control apparatus including:
a randomizer configured to:
randomize write data output from an arithmetic processing apparatus, and
output the randomized write data to a memory, and
a derandomizer configured to:
derandomize data read from the memory, and
generate derandomized read data when a flag included in the data read from the memory indicates the randomized write data; and
a selector configured to:
select the derandomized read data and output the selected derandomized read data to the arithmetic processing apparatus when the flag indicates the randomized write data, and
select the data read from the memory and output the selected data read from the memory to the arithmetic processing apparatus when the flag indicates deleted data.

6. The information processing apparatus according to claim 5, further comprising:
a control circuit configured to:
write randomized write data including a flag having a first logical value to the memory, when the control circuit receives a write request from the arithmetic processing apparatus, and
write deleted data including a flag having a second logical value to the memory, when the control circuit receives a delete request from the arithmetic processing apparatus,
wherein when the flag included in the data read from the memory has the first logical value, the derandomizer configured to:
derandomize the data read from the memory, and
generate the derandomized read data,
wherein when the flag included in the data read from the memory has the first logical value, the selector configured to:
select the derandomized read data, and
output the selected derandomized read data to the arithmetic processing apparatus,
wherein when the flag included in the data read from the memory has the second logical value, the selector is configured to:
select the data read from the memory, and
output the selected data read from the memory to the arithmetic processing apparatus.

7. The information processing apparatus according to claim 6,
wherein all logical values included in the deleted data are equal to the second logical value.

8. The information processing apparatus according to claim 5,
wherein the memory is a NAND flash memory.

9. A memory control method executed by a processor included in a memory control apparatus, the memory control method comprising:
randomizing write data output from an arithmetic processing apparatus;
outputting the randomized write data to a memory;
derandomizing data read from the memory;
generating derandomized read data when a flag included in the data read from the memory indicates the randomized write data;

selecting the derandomized read data and outputting the selected derandomized read data to the arithmetic processing apparatus when the flag indicates the randomized write data; and selecting the data read from the memory and outputting the selected data read from the memory to the arithmetic processing apparatus when the flag indicates deleted data.

10. The memory control method according to claim 9, further comprising:

writing randomized write data including a flag having a first logical value to the memory, when the control circuit receives a write request from the arithmetic processing apparatus; and writing deleted data including a flag having a second logical value to the memory, when the control circuit receives a delete request from the arithmetic processing apparatus, wherein when the flag included in the data read from the memory has the first logical value, derandomizing the data read from the memory, and generating the derandomized read data, and when the flag included in the data read from the memory has the first logical value, selecting the derandomized read data, and outputting the selected derandomized read data to the arithmetic processing apparatus, and when the flag included in the data read from the memory has the second logical value, selecting the data read from the memory, and outputting the selected data read from the memory to the arithmetic processing apparatus.

11. The memory control method according to claim 9, wherein all logical values included in the deleted data are equal to the second logical value.

12. A memory control device comprising:

a randomizer configured to:

randomize write data output from an arithmetic processing device, and output the randomized write data to a memory;

a derandomizer configured to:

derandomize data read from the memory, and generate derandomized read data when a flag included in the data read from the memory indicates the randomized write data; and a selector configured to:

select the derandomized read data and output the selected derandomized read data to the arithmetic processing device when the flag indicates the randomized write data, and select data indicating deleted data and output the data indicated deleted data to the arithmetic processing device when the flag indicates the deleted data.

13. The memory control device according to claim 12, wherein a flag having a first logical value is written with the randomized write data stored in the memory when a write request is received from the arithmetic processing device, and the flag having a second logical value is written with data indicating deleted data when a delete request is received from the arithmetic processing device.

* * * * *